(12) United States Patent
Flagello

(10) Patent No.: US 9,366,952 B2
(45) Date of Patent: *Jun. 14, 2016

(54) LITHOGRAPHIC SUBSTRATE AND A DEVICE

(71) Applicant: ASML HOLDING N.V., Veldhoven (NL)

(72) Inventor: Donis George Flagello, Scottsdale, AZ (US)

(73) Assignee: ASML HOLDING N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/739,886

(22) Filed: Jun. 15, 2015

(65) Prior Publication Data

US 2015/0277222 A1  Oct. 1, 2015

Related U.S. Application Data

(63) Continuation of application No. 12/463,679, filed on May 11, 2009, now Pat. No. 9,086,633.

(60) Provisional application No. 61/071,704, filed on May 14, 2008.

(51) Int. Cl.
| | |
|---|---|
| H01L 21/312 | (2006.01) |
| G03F 1/42 | (2012.01) |
| G03F 7/095 | (2006.01) |
| G03F 7/12 | (2006.01) |
| G03F 7/40 | (2006.01) |
| G03F 7/20 | (2006.01) |
| G03F 7/26 | (2006.01) |

(52) U.S. Cl.
CPC *G03F 1/42* (2013.01); *G03F 7/095* (2013.01); *G03F 7/12* (2013.01); *G03F 7/20* (2013.01); *G03F 7/26* (2013.01); *G03F 7/405* (2013.01); *G03F 7/70325* (2013.01); *Y10T 428/24479* (2015.01); *Y10T 428/24802* (2015.01)

(58) Field of Classification Search
USPC .................................................. 430/325, 328
See application file for complete search history.

(56) References Cited

U.S. PATENT DOCUMENTS

| | | | |
|---|---|---|---|
| 6,258,514 B1 | 7/2001 | Montgomery | |
| 7,998,661 B2 | 8/2011 | Kim et al. | |
| 9,086,633 B2 * | 7/2015 | Flagello | ................. G03F 7/095 |
| | | | 430/328 |
| 2008/0145793 A1 | 6/2008 | Patel et al. | |

FOREIGN PATENT DOCUMENTS

| | | |
|---|---|---|
| JP | 2003-100600 | 4/2003 |
| JP | 2004-235574 | 8/2004 |
| JP | 2006-013216 | 1/2006 |
| JP | 2006-080467 | 3/2006 |
| JP | 2007-095859 | 4/2007 |
| JP | 2010-507906 | 3/2010 |
| WO | 2008/049844 | 5/2008 |

OTHER PUBLICATIONS

Japanese Office Action mailed Sep. 13, 2011 in corresponding Japanese Patent Application No. 2009-114604.
Japanese Office Action mailed May 8, 2012 in corresponding Japanese Patent Application No. 2009-114604.

* cited by examiner

*Primary Examiner* — Daborah Chacko Davis
(74) *Attorney, Agent, or Firm* — Pillsbury Winthrop Shaw Pittman LLP

(57) ABSTRACT

A lithographic method is disclosed that includes, on a substrate provided with a layer of a resist and a further layer of a material provided on the layer of resist, providing a pattern in the further layer, the pattern defining a space via which an area of the layer of resist may be exposed to radiation, a distance between features of the pattern defining the space, and exposing the layer of resist to radiation having a wavelength greater than the distance between features of the pattern defining the space, such that near-field radiation is generated which propagates into and exposes an area of the resist.

20 Claims, 7 Drawing Sheets

LITHOGRAPHIC SUBSTRATE AND A DEVICE

This application is a continuation application of co-pending U.S. patent application Ser. No. 12/463,679, filed May 11, 2009, which claims priority and benefit under 35 U.S.C. §119(e) to U.S. Provisional Patent Application No. 61/071, 704, entitled "Lithographic Method", filed on May 14, 2008. The content of each of the foregoing applications is incorporated herein in its entirety by reference.

FIELD

The present invention relates to a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In device manufacturing methods using a lithographic apparatus, the minimum feature size, often referred to as the critical dimension (CD), is determined by the wavelength ($\lambda$) of the exposure radiation and the numerical aperture (NA) of the projection system used by the lithographic apparatus. Various techniques have been developed to reduce the critical dimension, and the effects of these techniques are commonly combined into a scaling factor known as k1. The relationship between the scaling factor, the numerical aperture, the wavelength of the radiation used, and the critical dimension is as follows:

$$CD = k1 \cdot \lambda/NA$$

A process to obtain a reduced scaling factor comprises using near field imaging to expose a layer of resist, which involves the generation and use of near-field radiation. In a known method, the near-field radiation is generated using a specifically designed mask which is independent of a resist coated substrate to which a pattern is to be applied. In order to use the near-field radiation to apply a pattern to the resist on the substrate, the mask needs to be accurately spaced apart from the resist across all areas of the resist to be patterned, or alternatively the mask needs to be brought into contact with all areas of the resist to be patterned. In practice, it is difficult to achieve the accurate separation between the mask and the resist that is required to accurately apply patterns to the resist. Alternatively, if the mask is to be brought into contact with the resist, it is difficult to ensure that all areas of the resist to be patterned are actually in contact with the mask, and it is also possible that the mask may damage the resist when it is brought into contact with it.

SUMMARY

It is desirable to provide, for example, a lithographic method which obviates or mitigates one or more of the problems mentioned above and/or one or more other problems. For example, it is desirable to provide, for example, a lithographic method which does not require a near-field generating mask to be accurately spaced from a resist coated substrate, or brought into contact with the resist.

According to an aspect of the invention, there is provided a lithographic method comprising, on a substrate provided with a layer of a resist, and a further layer of a material provided on the layer of resist: providing a pattern in the further layer, the pattern defining a space via which an area of the layer of resist may be exposed to radiation, a distance between features of the pattern defining the space; exposing the layer of resist to radiation having a wavelength greater than the distance between features of the pattern defining the space, such that near-field radiation is generated which propagates into and exposes an area of the resist.

In an embodiment, there is no gap between the further layer and the layer of resist to be exposed to the near-field radiation, and so there is no need or requirement to accurately control the gap between the two layers. Similarly, in an embodiment, there is no need to consider how to bring the further layer into contact with an area of resist to be patterned since the further layer is already in contact with the layer of resist since it was provided on that layer.

The material may be a metal, a second resist or a silylated resist. The metal may be chromium.

The method may further comprise applying a silylation process to the exposed area of resist.

The method may further comprise removing the further layer. The method may further comprise developing or etching the resist.

Exposing the layer of resist to radiation may comprise exposing the resist to polarized radiation. Exposing the layer of resist to radiation may comprise exposing the resist to radiation which is incident at an angle substantially normal to the layer of resist.

The method may further comprise providing the layer of resist on the substrate. The method may further comprise providing the further layer on the layer of resist.

According to an aspect of the invention, there is provided a device, or a part of a device, manufactured according the method described herein.

According to an aspect of the invention, there is provided a substrate provided with: a layer of resist on the substrate; and a further layer of material on the layer of resist, the further layer provided with a pattern defining a space via which an area of the layer of resist may be exposed to radiation, a distance between features of the pattern defining the space, wherein the distance between features of the pattern defining the space is arranged to be less than a wavelength of radiation to which the layer of resist is to be exposed, such that during that exposure, near-field radiation is generated which propagates into and exposes an area of the resist.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
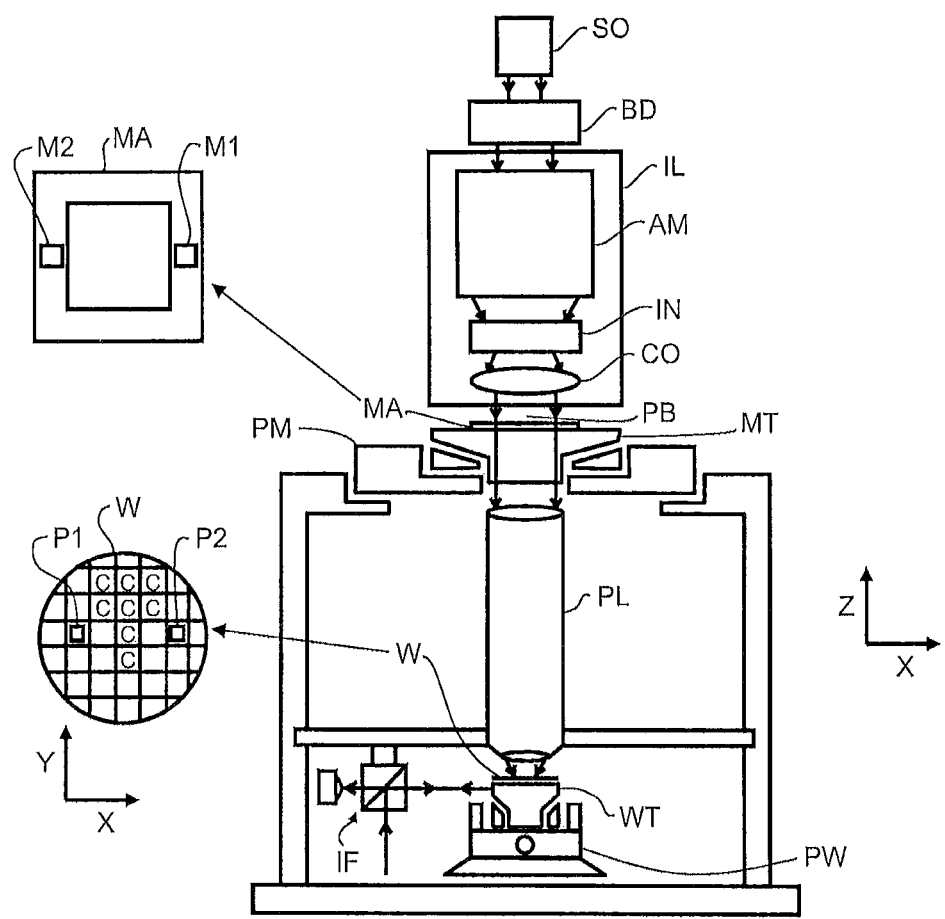
FIG. 1 schematically depicts an embodiment of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed, more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment. The apparatus comprises:

an illumination system (illuminator) IL to condition a beam PB of radiation (e.g, UV, DUV or EUV radiation, or radiation having an even shorter wavelength);

a support structure (e.g. a support structure) MT to support a patterning device (e.g. a mask) MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The illumination system may encompass various types of optical components, including refractive, reflective, and catadioptric optical components to direct, shape, or control the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to the projection system.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, current methods and apparatus to reduce the minimum feature size (i.e. critical dimension) of a pattern by reducing the scaling factor k1 have various associated problems. FIGS. 2a to 2e depict process steps according to an embodiment of the present invention which may overcome one or more of these and/or other problems. FIGS. 2a to 2e depict process steps which allow the scaling factor k1 to be less than 0.25, thereby reducing the minimum feature size of a pattern applied to a layer of resist. More generally, FIGS. 2a to 2e depict process steps which allow features to be applied to a layer of resist which have dimensions which are less than the wavelength of radiation to which the resist is exposed.

Figure 2A:
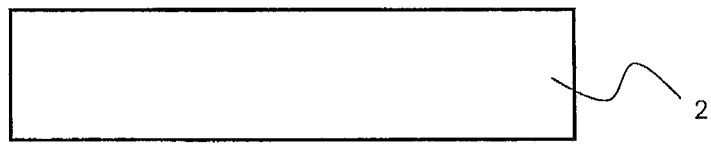
FIGS. 2a to 2e schematically depict process steps to provide a further layer on top of a layer of resist, for use in applying a pattern to the layer of resist, in accordance with an embodiment of the present invention.
Figure 2B:
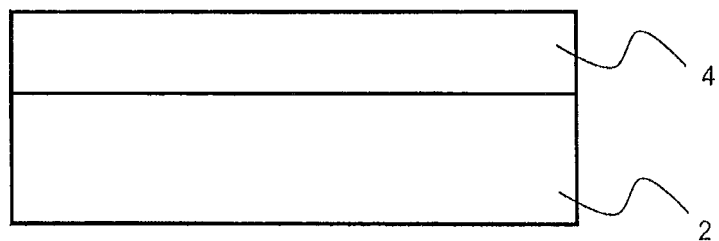
Figure 2C:
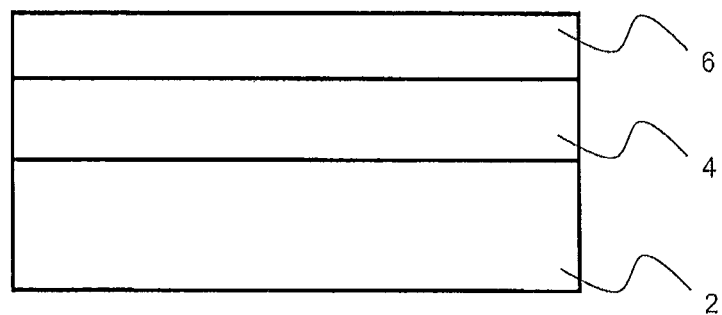

FIG. 2a shows a substrate 2, suitable for use in lithography. The substrate 2 may be, for example, the substrate described above in relation to the apparatus of FIG. 1. FIG. 2b shows that the substrate 2 has been provided with a layer of resist 4. FIG. 2c shows that a chromium layer 6 (i.e. a further layer) has been provided on top of the layer of resist 4. The further layer provided on top of the layer of resist 4 may be a material other than chromium, and may be, for example, another metal, or another layer of resist or silylated resist.

Figure 2D:
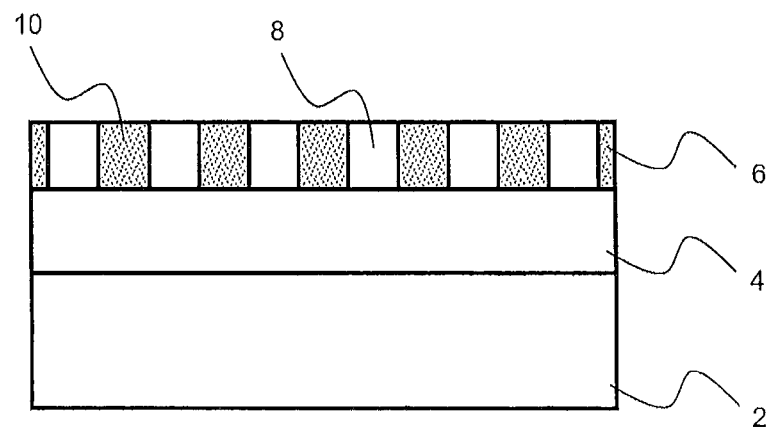

FIG. 2d shows that the chromium layer 6 is processed in order to provide chromium pattern features 8 which are to remain on the resist layer 4, and chromium regions 10 which are to be removed from the resist layer 4. Chromium pattern features 8 can be created using known lithographic processing techniques. Such techniques may involve the deposition of a further resist layer on top of the chromium layer 6, patterning of the further resist layer using a patterned radiation beam, and subsequent development of the further layer of resist and etching away of the chromium regions 10 not providing the chromium pattern features 8. The chromium pattern features 8 may be provided by lithographically printing a line-space pattern in the chromium layer 6 using 193 nm radiation.

Figure 2E:
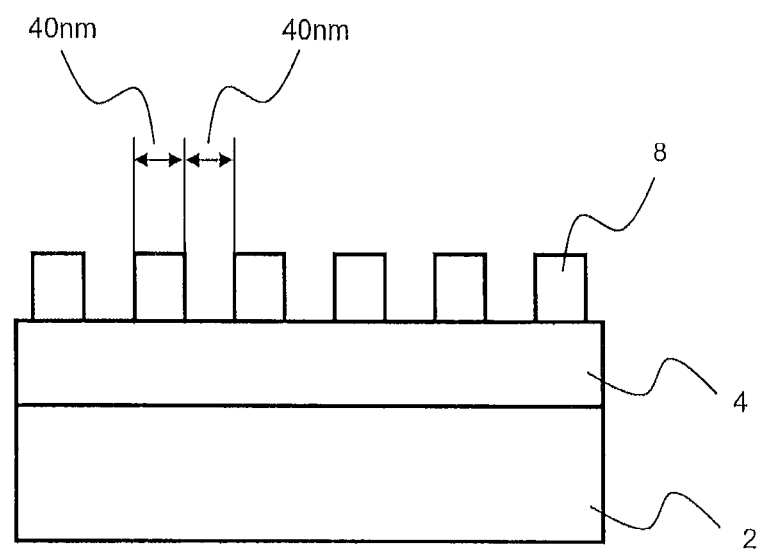

FIG. 2e shows the resultant chromium pattern features 8 on the layer of resist 4. The chromium features 8 have a width of 40 nm, and are separated from each other by 40 nm. In other words, the chromium features have a pitch of 80 nm, a width of 40 nm and therefore a duty cycle of 50%. The depicted chromium pattern features 8 have sidewalls that are substantially perpendicular to the layer of resist 4. However, the chromium pattern features 8 may have a different shape. For example, the sidewalls may be sloping (e.g. having a retrograde slope) in order to focus radiation onto or into the resist.

It will be appreciated that the wavelength of radiation used to create the 40 nm chromium pattern features 8 is described above as being 193 nm. The creation of the 40 nm chromium pattern features 8, which have a smaller dimension than the wavelength of radiation used to provide the features 8, may be achieved using various techniques, such as for example, immersion lithography, double exposure and/or double patterning techniques.

The chromium pattern features 8 are separated from one another by a distance which is less than a wavelength of radiation which is to be subsequently used to expose the layer of resist 4. The significance of such a separation will be described in more detail below.

Figure 3:
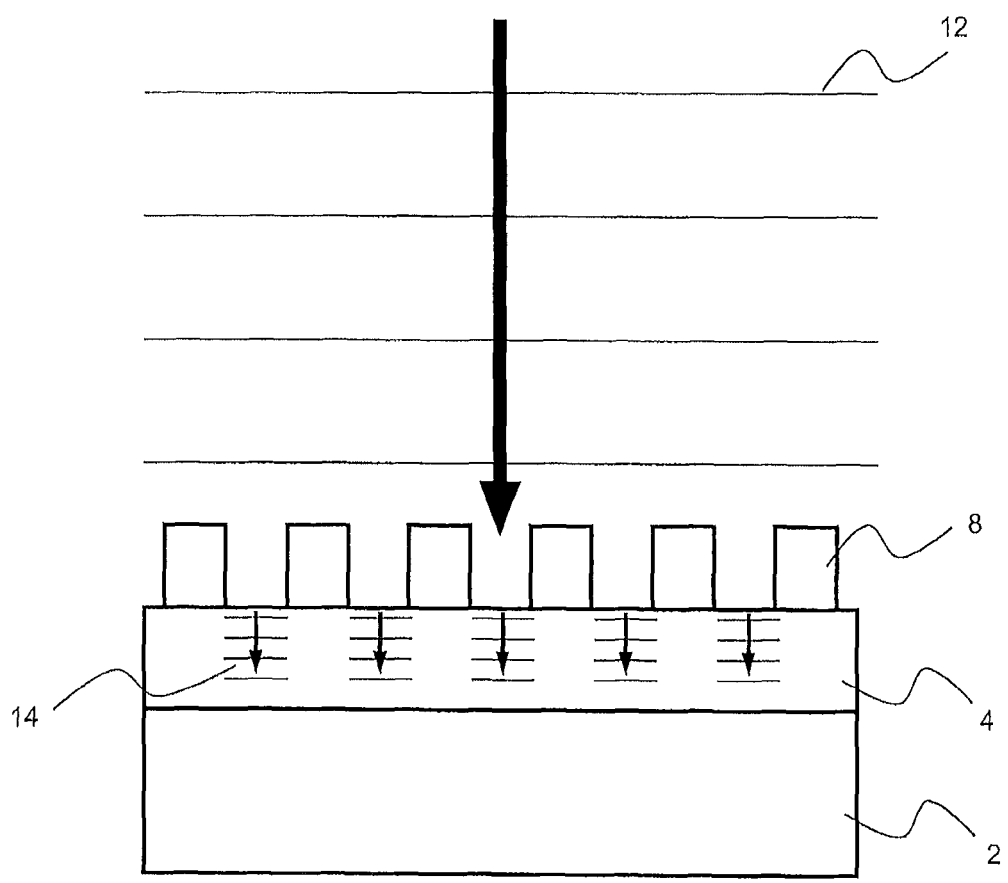
FIG. 3 schematically depicts an exposure process, and associated operating principles, to apply a pattern to the layer of resist described in relation to FIGS. 2a to 2e.

FIG. 3 shows the chromium pattern features 8 and underlying resist layer 4 being exposed to a flood exposure at normal incidence, for example TM polarized radiation having a wavelength of 436 nm. The TM polarized radiation is polarized in a direction parallel to the width of the pattern features 8 (i.e. perpendicular to lines defined by the width extending into/out of the plane of FIG. 3). This exposure of the chromium pattern features 8 and underlying layer of resist 4 is undertaken using radiation 12 having a wavelength which is longer than the distance between adjacent chromium pattern features 8, which in this particular example is 40 nm. Generally speaking, radiation does not pass through an aperture having a size which is smaller than the wavelength of the radiation. However, due to the space between the chromium pattern features 8 being less than the wavelength of the flood exposure radiation 12, near-field radiation 14 is generated which leaks slightly in the vicinity of the spaces between the chromium pattern features 8. The near-field radiation comprises a propagating part and a non-propagating part (i.e., an evanescent part), and is present in the vicinities of the spaces between the chromium pattern features 8 at a distance of about 100 nm or less from those spaces. The near-field radiation 14 attenuates significantly as the distance into the resist layer 4 increases.

The near-field radiation 14 exposes areas of the resist layer 4 between the chromium pattern features 8. It will be appreciated that despite the flood exposure radiation 12 having a wavelength more than ten times greater than the separation between the chromium pattern features 8, underlying areas of the resist layer 4 can still be exposed to the radiation 12 due to the generation and propagation of near-field radiation 14 in the resist layer 4.

Figure 4:
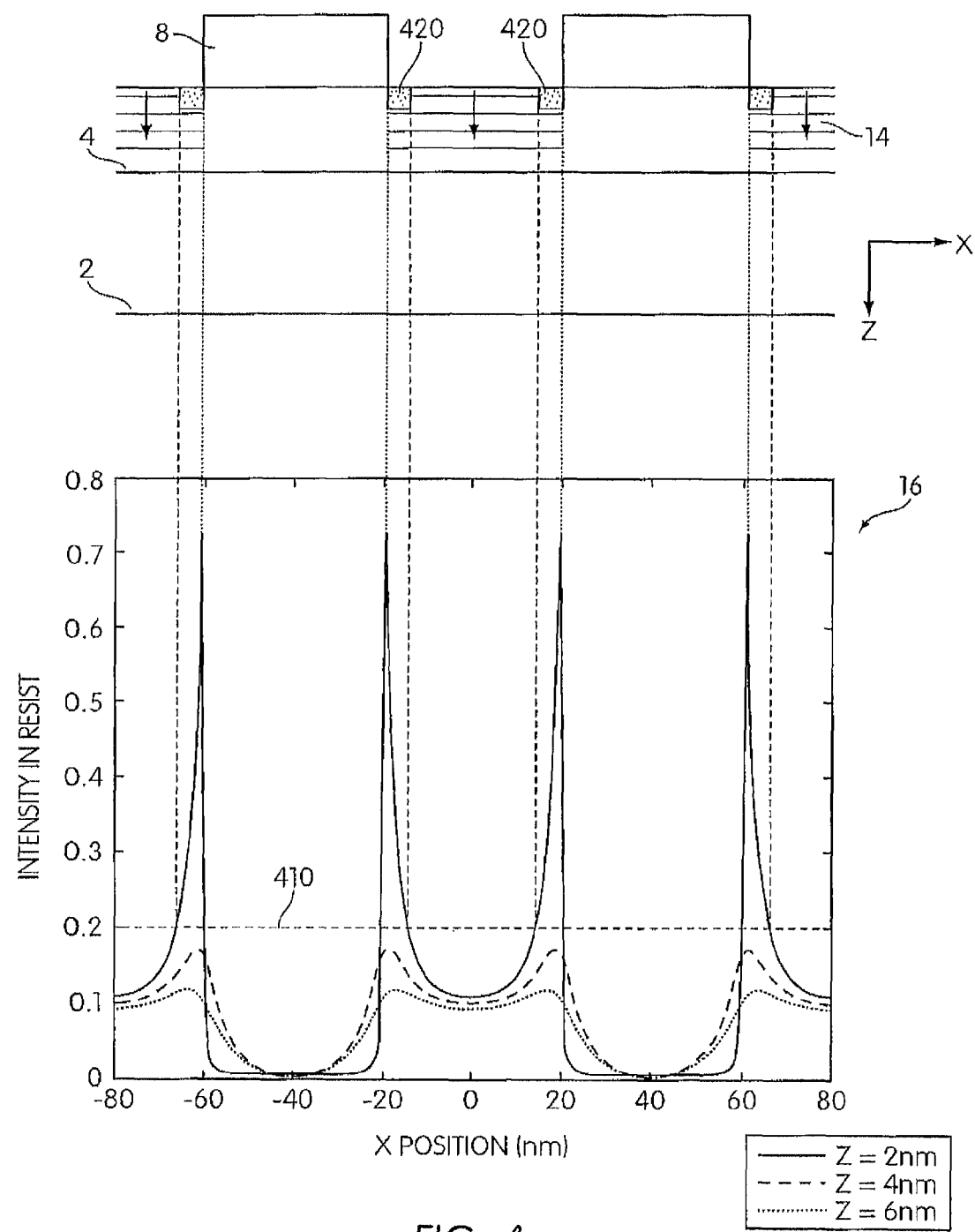
FIG. 4 schematically depicts the effect of exposure of the layer of resist to near-field radiation generated by the further layer.

Areas of the layer of resist 4 located in the spaces between the chromium pattern features 8 are not uniformly exposed to the near-field radiation 14. This is because the near-field radiation 14 effectively creeps along the side walls of the chromium pattern features 8 before propagating into and exposing an area of resist 4 adjacent to the side walls. Such non uniform exposure of the areas of the layer of resist 4 in the spaces in between the chromium pattern features 8 is shown in FIG. 4. FIG. 4 shows a part of the substrate 2, layer of resist 4, and chromium pattern features 8 shown in and described with reference to FIG. 3. A graph 16 shows how the modeled intensity of the near-field radiation 14 is distributed at different depths z in the resist, and how the distribution varies in the x-direction (which is left to right as shown in FIG. 4).

Because the near-field radiation 14 creeps along and down the side walls of the chromium pattern features 8, it can be seen that the intensity of the near-field radiation 14 is highest in the area adjacent to and below the side walls. As the near-field radiation 14 propagates deeper into the layer of resist 4, the exposure (i.e. the intensity) becomes more uniform. It can be seen from the graph 16 that at a depth of around 2 nm from an upper surface of the layer of resist 4, and in the vicinity of the side walls of the chromium pattern features 8, the intensity of the near-field radiation 14 is high, and falls away rapidly as the intensity is measured further away from the side walls in the x-direction. It can be seen from the graph 16 that this means that down to a depth of around 2 nm to 3 nm very narrow regions 420 of resist are exposed above a threshold exposure intensity 410 by the near-field radiation 14. From the graph 16, it can be seen that the width of this regions 420 is less than 10 nm, which is over nineteen times less than the wavelength of the 193 nm radiation used to pattern the chromium layer 6. Thus, the reduction of the critical dimension of pattern features applied to a layer of resist as obtained with the process shown in and described with reference to FIGS. 2 to 4 can effectively reduce the scaling factor k1 to a value below 0.25.

It can also be seen from the graph 16 that a peak in the intensity of the near-field radiation 14 in the layer of resist 4 occurs at the location of each side wall of the chromium pattern features 8. For every chromium pattern feature 8, there are two side walls, and therefore two sub-10 nm regions 420 exposed above threshold to the near-field radiation 14. Thus, regions 420 of resist 4 exposed to the near-field radiation 14 form a pattern having double the pitch of the pattern of chromium pattern features 8.

If it is desirable to develop the layer of resist 4 in order to create pattern features having dimensions less than 10 nm, as described above, it may be desirable to apply a silylation to the areas of resist located between the chromium pattern features 8 in order to provide a pattern of silylated resist. Such a silylation process may be useful to ensure that it is possible to develop the resist, despite the fact that it is only been exposed to a depth of around, for example, 2 nm-3 nm. On the other hand, if the development of resist to obtain the sub-10 nm features is not required, such a silylation process may not be required. In this case, it may be possible to develop the areas of resist exposed to the near-field radiation, and not just the uppermost 2 nm of the layer of resist 4. In this case, the pattern features in the layer of resist 4 would have the same pitch and correspond to the pattern of the chromium pattern features 8.

Figure 5:
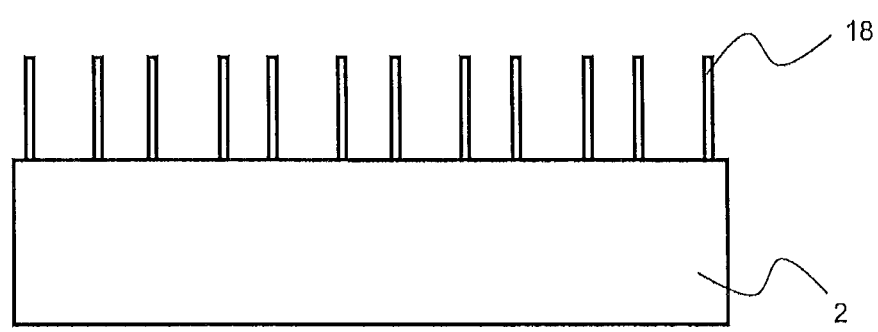
FIG. 5 schematically depicts pattern features that may be generated in accordance with an embodiment of the present invention.

FIG. 5 shows the substrate provided with a plurality of sub-10 nm resist pattern features 18 provided thereon. The sub-10 nm resist pattern features 18 have been provided by applying the patterning, exposure and silylation processes discussed above, removing the chromium pattern features and etching or developing the resist layer 4.

It will be appreciated that in comparison with known near-field exposure apparatus and methods, an embodiment of the present invention is advantageous. This is because there is no need to: create an independent near field mask to generate near-field radiation; accurately control a gap between this mask and a layer of resist; or accurately control a contact area between the mask and the layer of resist. This is because the layer of chromium (or other metal or resist) deposited on the layer of resist generates the required near-field radiation to which the resist is to be exposed. There is no gap between the chromium layer and the layer of resist to be exposed to the near-field radiation, so there is no need or requirement to accurately control the gap between the two layers. Similarly, there is no need to consider how to bring the chromium layer into contact with an area of resist to be patterned since the chromium layer is already in contact with the layer of resist since it was deposited on that layer.

In the above embodiments certain wavelengths of radiation, and also dimensions and separations of pattern features have been described. It will however be appreciated that other dimensions are possible. For instance the chromium layer (or other metal or resist layer) deposited on top of the resist layer to be exposed to near-field radiation can be patterned using radiation of any suitable wavelength, and is not restricted to being 193 nm. Similarly, the flood exposure undertaken to generate the near-field radiation may be any suitable wavelength, and is not restricted to being 436 nm. The flood exposure may comprise unpolarized radiation. The flood exposure may not be normally incident to the resist, but may be incident at another angle, for example a few degrees away from being normally incident. Furthermore, the pattern features provided in the chromium layer (or other metal layer or resist layer) do not need to be 40 nm in width, or separated by 40 nm. The pattern features need only be separated by a distance which is less than a wavelength of radiation used to expose the chromium layer in a subsequent flood exposure.

Figure 6:
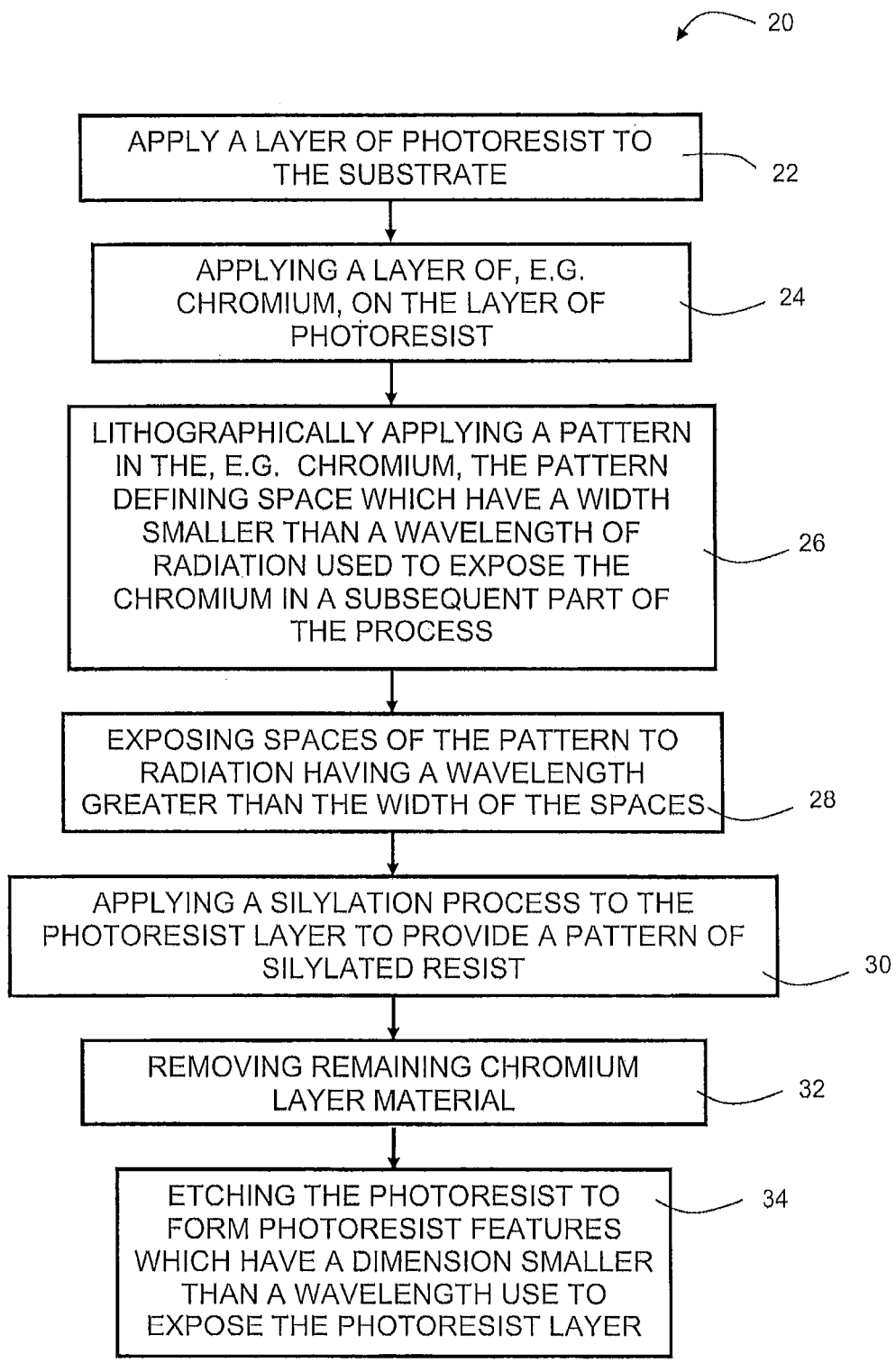
FIG. 6 is a flow chart schematically depicting a lithographic process according to an embodiment of the present invention.

FIG. 6 is a flow chart 20 schematically depicted in process steps in accordance with an embodiment of the present invention. The flow chart 20 provides a summary of the embodiments described above. In a first step 22 a layer of resist is applied to a substrate. In a second step 24 a layer of, for example, chromium, is deposited on the layer of resist. In a third step 26 a pattern is then lithographically applied in the, for example, chromium layer. The pattern defines spaces which have a width smaller than a wavelength of radiation used to expose the chromium layer in a subsequent part of the process, as described above. In a fourth step 28 the spaces in the chromium pattern are then exposed to a radiation having a wavelength greater than the width of the spaces in the pattern. Near-field radiation is generated, which exposes the resist located in the spaces. Next, and if it is desirable to extract features from the layer of resist which have only been predominantly exposed in the uppermost few nanometers of the resist, a fifth step 30 is undertaken which involves applying a silylation process to the exposed areas of resist. In a sixth step 32, the chromium pattern is then removed. Finally, in a seventh step 34 the resist is developed and/or etched to form features which have a dimension (e.g. width) which is smaller than the wavelength used to expose the resist layer.

In an embodiment, there is provided a lithographic method comprising, on a substrate provided with a layer of a resist, and a further layer of a material provided on the layer of resist: providing a pattern in the further layer, the pattern defining a space via which an area of the layer of resist may be exposed to radiation, a distance between features of the pattern defining the space; and exposing the layer of resist to radiation having a wavelength greater than the distance between features of the pattern defining the space, such that near-field radiation is generated which propagates into and exposes an area of the resist.

In an embodiment, the material is a metal, a second resist or a silylated resist. In an embodiment, the metal is chromium. In an embodiment, the method further comprises applying a silylation process to the exposed area of resist. In an embodiment, the method further comprises removing the further layer. In an embodiment, the method further comprises developing or etching the resist In an embodiment, exposing the layer of resist to radiation comprises exposing the resist to polarized radiation. In an embodiment, exposing the layer of resist to radiation comprises exposing the resist to radiation which is incident at an angle substantially normal to the layer of resist. In an embodiment, the method further comprises providing the layer of resist on the substrate. In an embodiment, the method further comprises providing the further layer on the layer of resist.

In an embodiment, there is provided a substrate having: a layer of resist on the substrate; and a further layer of material on the layer of resist, the further layer having a pattern defining a space via which an area of the layer of resist may be exposed to radiation, a distance between features of the pattern defining the space, wherein the distance between features of the pattern defining the space is arranged to be less than a wavelength of radiation to which the layer of resist is to be exposed, such that during that exposure, near-field radiation is generated which propagates into and exposes an area of the resist. In an embodiment, the material is a metal, a second resist or a silylated resist. In an embodiment, the metal is chromium.

In an embodiment, there is provided a device, or a part of a device, manufactured according to a method comprising, on a substrate provided with a layer of a resist, and a further layer of a material provided on the layer of resist: providing a pattern in the further layer, the pattern defining a space via which an area of the layer of resist may be exposed to radiation, a distance between features of the pattern defining the space; and exposing the layer of resist to radiation having a wavelength greater than the distance between features of the pattern defining the space, such that near-field radiation is generated which propagates into and exposes an area of the resist.

In an embodiment, the material is a metal, a second resist or a silylated resist. In an embodiment, the metal is chromium. In an embodiment, the method further comprises applying a silylation process to the exposed area of resist. In an embodiment, exposing the layer of resist to radiation comprises exposing the resist to polarized radiation.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting, Thus, it will be apparent to those skilled in the art that modifications may be made to the invention as described without departing from the scope of the claims set out below.

The invention claimed is:

1. A substrate having:
   a layer of resist on the substrate; and
   a further layer of material on the layer of resist, the further layer having a pattern defining a space via which an area of the layer of resist may be illuminated by radiation, a distance between features of the pattern defining the space and the material of the further layer is optically opaque to the radiation,
   wherein the distance between features of the pattern defining the space is arranged to be less than a wavelength of the radiation, such that during illumination of the area of the layer of resist by the radiation, near-field radiation is generated which propagates into and exposes at least a portion of the area of the layer of resist sufficiently to meet or exceed an exposure intensity threshold of the resist.

2. The substrate of claim 1, wherein the material comprises a metal.

3. The substrate of claim 2, wherein the metal is chromium.

4. A device, or a part of a device, manufactured according to a method comprising, on a substrate provided with a layer of a resist, and provided with a further layer of a material provided on the layer of resist, wherein the further layer has a pattern defining a space via which an area of the layer of resist may be illuminated by radiation and wherein the material of the further layer is optically opaque to the radiation:
   illuminating the area of the layer of resist with the radiation, wherein a wavelength of the radiation is greater than a distance between features of the pattern defining the space, such that near-field radiation is generated which propagates into and exposes at least a portion of the area of the layer of resist sufficiently to meet or exceed an exposure intensity threshold of the resist.

5. The device of claim 4, wherein the material comprises a metal.

6. The device of claim 5, wherein the metal is chromium.

7. The device of claim 4, wherein the method further comprises applying a silylation process to the exposed at least portion of the area of the layer of resist.

8. The device of claim 4, wherein illuminating the area of the layer of resist with the radiation comprises illuminating the area of the layer of resist with polarized radiation.

9. The device of claim 4, wherein illuminating the area of the layer of resist with the radiation comprises illuminating the area of the layer of resist with radiation which is incident at an angle substantially normal to the area of the layer of resist.

10. The device of claim 4, wherein illuminating the area of the layer of resist with the radiation comprises illuminating a portion of the area of the layer of resist such that the exposure intensity threshold of the resist has not been exceeded.

11. The device of claim 10, wherein the portion for which the exposure intensity threshold of the resist has not been exceeded is located between at least two portions of the area for which the exposure intensity threshold of the resist has been met or exceeded.

12. The device of claim 4, wherein a width of the portion for which the exposure intensity threshold of the resist has been met or exceeded is less than or equal to 10 nm.

13. The device of claim 4, wherein a depth of the portion for which the exposure intensity threshold of the resist has been met or exceeded is less than or equal to 3 nm.

14. A device, or a part of a device, manufactured according to a method comprising, on a substrate provided with a layer of a resist, and provided with a further layer of a material provided on the layer of resist, wherein the further layer has a pattern defining a space via which an area of the layer of resist may be illuminated by radiation:
   illuminating the area of the layer of resist with the radiation, wherein a wavelength of the radiation is greater than a distance between features of the pattern defining the space, such that near-field radiation is generated which propagates into and exposes the area of the layer of resist, the area of the layer of resist comprising, in the space, at least two portions for which an exposure intensity threshold of the resist has been met or exceeded and a portion for which the exposure intensity threshold of the resist has not been exceeded located between the at least two portions.

15. The device of claim 14, wherein a width of the portion for which an exposure intensity threshold of the resist has been met or exceeded is less than or equal to 10 nm.

16. The device of claim 14, wherein a depth of the portion for which an exposure intensity threshold of the resist has been met or exceeded is less than or equal to 3 nm.

17. The device of claim 14, wherein the method further comprises applying a silylation process to the exposed at least portion of the area of the layer of resist.

18. The device of claim 14, wherein the method further comprises developing or etching the exposed at least portion of the area of the layer of resist to remove a portion of the resist from the exposed at least portion of the area while leaving another portion of the resist in the area of the layer of resist to remain.

19. The device of claim 14, wherein illuminating the area of the layer of resist with the radiation comprises illuminating the area of the layer of resist with polarized radiation.

20. The device of claim 14, wherein illuminating the area of the layer of resist with the radiation comprises illuminating the area of the layer of resist with radiation which is incident at an angle substantially normal to the area of the layer of resist.

* * * * *